(12) United States Patent
Tsunoi et al.

(10) Patent No.: US 6,787,925 B2
(45) Date of Patent: Sep. 7, 2004

(54) MOUNTING METHOD OF SEMICONDUCTOR DEVICE

(75) Inventors: Kazuhisa Tsunoi, Kawasaki (JP); Hidehiko Kira, Kawasaki (JP); Shunji Baba, Kawasaki (JP); Akira Fujii, Kawasaki (JP); Toshihiro Kusagaya, Kawasaki (JP); Kenji Kobae, Kawasaki (JP); Norio Kainuma, Kawasaki (JP); Naoki Ishikawa, Kawasaki (JP); Satoshi Emoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/805,559

(22) Filed: Mar. 14, 2001

(65) Prior Publication Data

US 2001/0011774 A1 Aug. 9, 2001

Related U.S. Application Data

(62) Division of application No. 09/045,115, filed on Mar. 20, 1998, now Pat. No. 6,458,237.

(30) Foreign Application Priority Data

May 19, 1997 (JP) .............................................. 9-128898
Oct. 22, 1997 (JP) .............................................. 9-289836

(51) Int. Cl.[7] ........................ H01L 23/48; H01L 23/29
(52) U.S. Cl. ...................... 257/783; 257/789; 257/787; 257/782; 257/783; 257/778
(58) Field of Search ................................ 257/783, 787, 257/789, 782, 778, 738, 737

(56) References Cited

U.S. PATENT DOCUMENTS

| 4,442,966 A | 4/1984 | Jourdain et al. |
| 5,245,750 A | 9/1993 | Crumly et al. |
| 5,403,424 A | 4/1995 | Ehrat et al. |
| 5,545,589 A | 8/1996 | Tomura et al. |
| 5,706,579 A | 1/1998 | Ross |
| 5,726,500 A * | 3/1998 | Duboz et al. ................ 257/777 |
| 5,747,881 A * | 5/1998 | Hosomi et al. ............. 257/762 |
| 5,783,465 A | 7/1998 | Canning et al. |
| 5,892,289 A * | 4/1999 | Tokuno ....................... 257/783 |
| 6,172,422 B1 * | 1/2001 | Chigawa et al. ............ 257/778 |

FOREIGN PATENT DOCUMENTS

| EP | 0 387 066 A1 | 9/1990 |
| EP | 0 388 011 A2 | 9/1990 |
| EP | 0 596 393 A1 | 5/1994 |
| EP | 0 724 289 A2 | 7/1996 |

(List continued on next page.)

OTHER PUBLICATIONS

Yoshihiro Bessho et al. "A Stud–Bump–Bonding Technique For High Density Multi–Chip–Module" Proceedings of the Japan International Electric Manufacturing Technology Symposium, US, New York, IEEE, vol. SYMP. 14, 1993, pps 326–365.

(List continued on next page.)

*Primary Examiner*—Jerome Jackson
*Assistant Examiner*—Joseph Nguyen
(74) *Attorney, Agent, or Firm*—Westerman, Hattori, Daniels & Adrian, LLP

(57) ABSTRACT

A method of mounting a semiconductor device having bumps on a board having pads so that each of the bumps is joined to a corresponding one of the pads is provided. Adhesive to be hardened by heat is provided between the semiconductor device and the board. The method includes the steps of pressing the bumps of the semiconductor device on the pads of the board, and heating a portion in which each of the bumps and a corresponding one of the pads are in contact with each other. A pressure of the bumps to the pads reaches a predetermined value before a temperature of the adhesive to which heat is supplied in the above step reaches a temperature at which the adhesive is hardened.

1 Claim, 8 Drawing Sheets

FOREIGN PATENT DOCUMENTS

| | | |
|---|---|---|
| EP | 0 753 890 A2 | 1/1997 |
| JP | 5-315395 | 11/1993 |
| JP | 6-151505 | 5/1994 |
| JP | 6-302649 | 10/1994 |
| JP | 07-193101 | 7/1995 |
| JP | 7-161769 | 6/1996 |
| WO | WO 96/05614 | 2/1996 |

OTHER PUBLICATIONS

Copy of European Patent Office Communication for European Patent Application No. 98302110 including European Search Report dated Feb. 21, 2000.

"Nomencalture For the Adhesive Industry" Jan. 1959, pp. 1–2 (156/325).

Copy of Office Action dated Feb. 20, 2003 from European Patent Office in Application No. 98 302 110.6—1235.

* cited by examiner

MOUNTING METHOD OF SEMICONDUCTOR DEVICE

This application is a divisional of prior application Ser. No. 09/045,115 filed Mar. 20, 1998 now U.S. Pat. No. 6,458,237.

BACKGROUND OF THE INVENTION (1) Field of the Invention

The present invention generally relates to a mounting method of a semiconductor device, and more particularly to a method of mounting a semiconductor device on a board in accordance with a COB (Chip On Board) method.

(2) Description of the Related Art

V various methods have been proposed as the COB (Chip On Board) method of mounting a semiconductor device on a board, based on purposes and uses of the semiconductor device. A flip-chip mounting method is one of the methods proposed as the COB method. In this mounting method, a semiconductor device (a semiconductor chip) is directly mounted on a board without wires connecting the semiconductor device to the board. The flip-chip mounting method is also called a wireless bonding mounting method.

A description will be given, with reference to FIGS. 1A through 1F, of the flip-chip mounting method.

Pads 2, which are electrodes, are formed on a chip 1 (the semiconductor device) to be mounted on a board 3. Pads 4 which are parts of conductive wiring patterns are formed on the board 3 on which the chip 1 is to be mounted.

First, bumps are formed as shown in FIG. 1A. Referring to FIG. 1A, an end portion of a gold wire 5 is pressed on a pad 2 of the chip 1 and heated by a boding tool so as to be joined to the pad 2. In this state, the gold wire 5 is then removed. As a result, a tear-drop shaped bump 6 is formed on the pad 2. On all the pads 2 of the chip 1, tear-drop shaped bumps 6 are formed in the same manner as that describe above.

Next, the tear-drop shaped bumps 6 are flattened as shown in FIG. 1B. Referring to FIG. 1B, the tear-drop shaped bumps 6 are pressed on a flat plate 7 so that only a point end portion of each of the tear-drop shaped bumps 6 is subjected to the plastic deformation. As a result, the tear-drop shaped bumps 6 are shaped into bumps 6 having substantially the same height.

Conductive paste is then transferred to a surface of each of the bumps 6 as shown in FIGS. 1C and 1D. That is, the end portions of the bumps 6 are immersed in a layer of conductive paste 8 as shown in FIG. 1C and then pulled up therefrom as shown in FIG. 1D. As a result, a drop of the conductive paste 8 is adhered to the end portion of each of the bumps 6. The conductive paste 8 is made, for example, of epoxy resin in which a large amount of silver fillers are distributed. Due to the drop of the conductive paste 8, positive electrical conductivity can be maintained between each of the bumps 6 of the chip 1 and a corresponding one of the pads 4 of the board 3 when the chip 1 is mounted on the board 3.

Next, adhesive 9 is applied to or printed on the surface of the board 3 so that the pads 4 are covered with the adhesive 9 as shown in FIG. 1E. A thermosetting insulating adhesive, made of material including epoxy resin as the principal ingredient, is used as the adhesive 9 to be applied to the board 3. In a state where the chip 1 is mounted on the board 3, the space between the chip 1 and the board is filled with the adhesive 9. As a result, the chip 1 and the board 3 are tightly joined to each other. In addition, a connecting portion in which each of the bumps 6 are joined to a corresponding one of the pads 4 is covered with the adhesive 9, so that moisture is prevented from entering the connection portion by the adhesive 9.

Finally, the chip 1 is mounted on the board 3 as shown in FIG. 1F. Referring to FIG. 1F, the chip 1 is positioned so that each of the bumps 6 of the chip 1 corresponds to one of the pads 4 of the board 3. A thermopressing head then presses the chip 1 on the board 3, so that each of the bumps 6 is pressed on a corresponding one of the pads 4 of the board 3. The adhesive 9 and the conductive paste 8 are thus hardened by the heat, so that the chip 1 is completely mounted on the board 3.

The board on which semiconductor devices are mounted is set and used in electronic equipment, such as a personal computer. Due to the heat generated by the semiconductor devices on the board, the interior of such electronic equipment is at a high temperature. Particularly, in a case where a processor operated at a high frequency is included in the semiconductor device, a large amount of heat is generated. On the other hand, in a case where the electronic equipment is not used, that is, a power supply of the electronic equipment is in an off-state, the interior temperature of the electronic equipment decreases to a room temperature.

The interior temperature variation of the electronic equipment affects the connecting portion in which each of the semiconductor devices and the board are connected to each other as follows.

As shown in FIG. 2, due to the temperature variation, the adhesive 9 between the semiconductor device 1 (the chip) and the board 3 is thermally expanded and contracted, so that the volume of the adhesive 9 is varies. Of course, thermal expansion and contraction occurs in the board 3, the semiconductor device 1 and the bumps 6. However the rate of expansion (contraction) thereof is less than that of expansion of the adhesive 9. Thus, in a case where the temperature is increased, the volume of the adhesive 9 is increased and the increase of the volume of the adhesive 9 functions as a force to increase the distance between the board 3 and the semiconductor device. As a result, a contact force of the bumps 6 to the pads 4 of the board 3 is decreased, so that an electric contact resistance between each of the bumps 6 and a corresponding one of the pads 4 is increased.

Further, when the temperature is repeatedly increased and decreased, the electrical contact resistance is successively increased and finally a disconnection may occur between the bumps 6 and the pads 4.

SUMMARY OF THE INVENTION

Accordingly, a general object of the present invention is to provide a novel and useful mounting method of a semiconductor device in which the disadvantages of the aforementioned prior art are eliminated.

A specific object of the present invention is to provide a method of mounting a semiconductor device on a board so that even if the volume of adhesive between the semiconductor device and the board is varied by the variation of temperature, an increase of the electrical contact resistance of the semiconductor device to the board can be prevented.

The above objects of the present invention are achieved by a method of mounting a semiconductor device including bumps, on a board having pads, so that each of said bumps is joined to a corresponding one of said pads, an adhesive to be hardened by heat being provided between said semiconductor device and said board, said method comprising the steps of: pressing said bumps of said semiconductor device on said pads of said board; and heating a portion in which each of said bumps and a corresponding one of said pads is in contact with each other, wherein a pressure of said bumps to said pads reaches a predetermined value before a temperature of said adhesive to which heat is supplied in step (b) reaches a hardening temperature at which said adhesive is hardened.

According to the present invention, since the bumps are pressed on the pads with a pressing force of a predetermined value before the adhesive is completely hardened, the bumps can be securely joined to the pads so as to provide a sufficient contact area. Thus, even if the hardened adhesive is expanded and contracted by the variation of temperature, the electrical contact between the bumps and the pads can be maintained.

BRIEF DESCRIPTION OF THE DRAWINGS

Other objects, features and advantages of the present invention will be apparent from the following description when read in conjunction with the accompanying drawings, in which.

DETAILED DESCRIPTION OF THE PREFERRED EMBODIMENTS

A description will be given, with reference to FIGS. 3 through 5, of a mounting method according to an embodiment of the present invention.

Figure 1A:
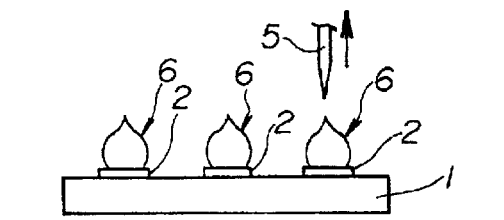
FIGS. 1A through 1F are diagrams illustrating a procedure of mounting a semiconductor device on a board.
Figure 1B:
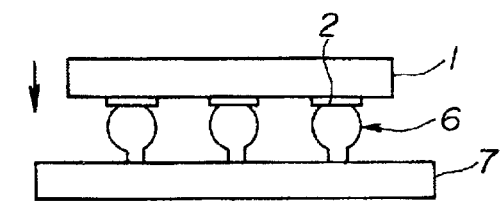
Figure 1C:
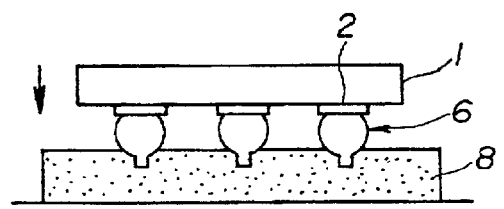
Figure 1D:
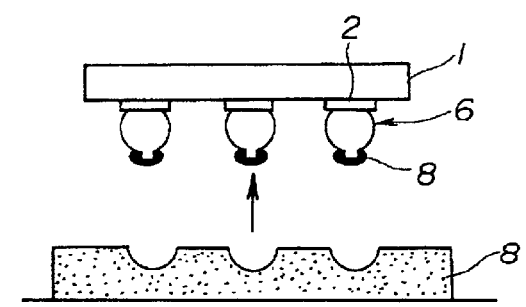
Figure 1E:
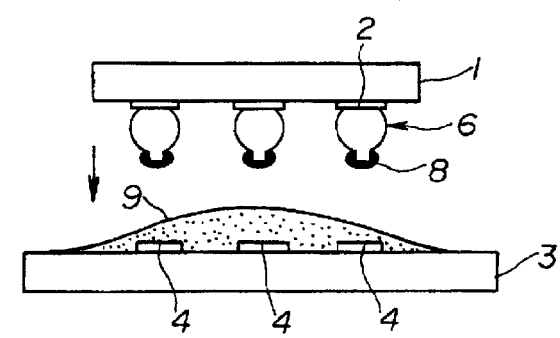
Figure 1F:
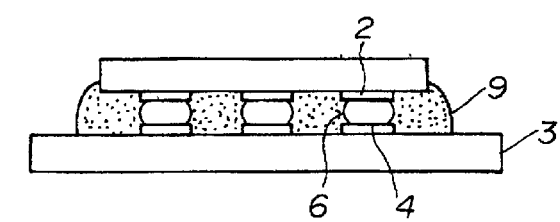
Figure 2:
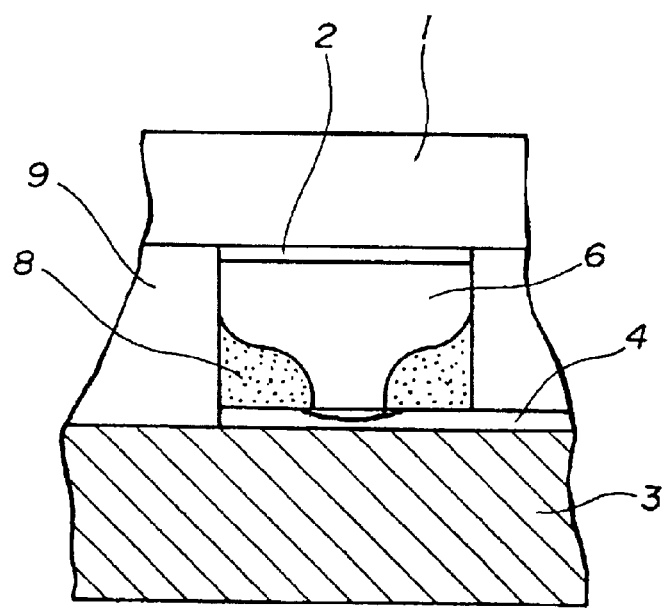
FIG. 2 is a cross sectional view showing a connecting portion in which the semiconductor device and the board are connected to each other.
Figure 3:
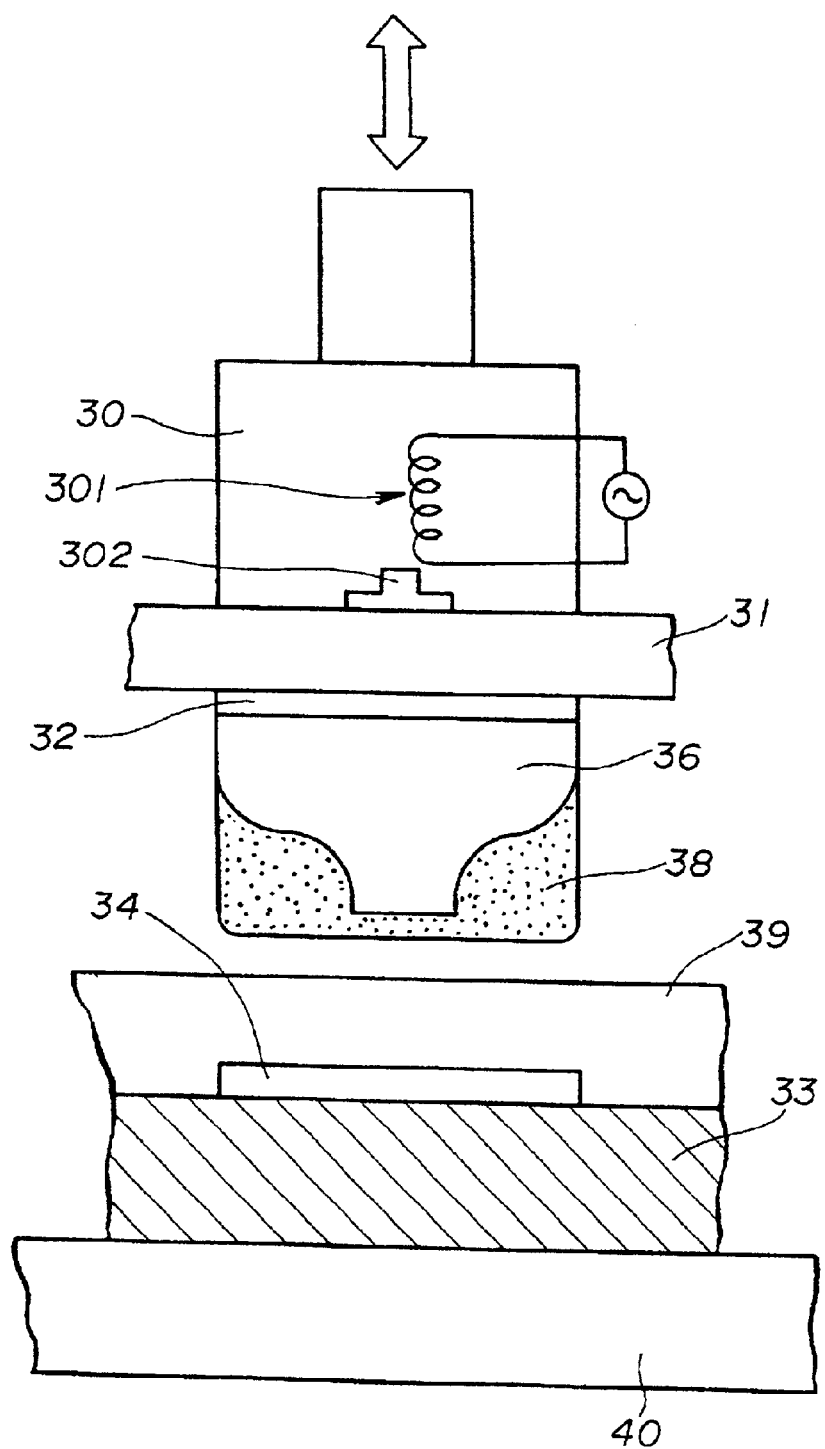
FIG. 3 is a diagram illustrating a relationship between the board and the semiconductor device supported by a head used in a thermopressing step.

Referring to FIG. 3, a chip 31 (the semiconductor device to be mounted) is supported by a thermopressing head 30. The chip 31 is mounted on a board 33 by an operation of the thermopressing head 30.

The thermopressing head 30 is movable in directions indicated by arrows in FIG. 3 and provided with a heater 301 and a vacuum cavity 302. The heater 301 is supplied with an electric current from a power supply. The heater 301 generates an amount of heat sufficient to warm up adhesive 39 (which will be described later) to a temperature needed to harden the adhesive 39. The vacuum cavity 302 is connected to a vacuum system (not shown) so as to support the chip 31 by a suction force of the vacuum.

A bump 36 made of gold (Au) is formed on a pad 32 of the chip 31. The bump 36 has a bowl-shaped root portion and an end portion.

An end of a gold wire is pressed on the pad 32 and heated by a bonding tool so as to be joined to the pad. The gold wire is then removed. As a result, the bump 36 having a tear-drop shape is formed on the chip 31. The point end portion of the tear-drop shaped bump 36 is flattened. Conductive paste 38 is then transferred to or printed on the surface of the flattened end portion of the bump 36. The conductive paste 38 is made of a thermosetting resin, such as the epoxy resin, in which silver (Ag) fillers are distributed. The conductive paste 38 transferred to the flattened end portion of the bump 36 is preheated so as to be in a semi-hardened state.

The surface of the chip 31 opposite to the surface on which a circuit is formed is held in position by the vacuum cavity 301, so that the chip 31 is supported by the thermopressing head 30.

The board 33 is positioned and fixed on a table 40. A pad 34 which should be electrically connected to the bump 36 is formed on the board 33. The pad 34 is generally made of copper (Cu).

The adhesive 39 is applied to the surface of the board by using a dispenser or a printing technique. The adhesive 39 is made of thermosetting insulating resin including epoxy resin as the principal ingredient. The adhesive 39 has a heating characteristic by which liquidity of the adhesive is produced by an initial heating stage and then is gradually hardened with increasing temperature. Thus, since liquidity of the adhesive 39 applied to the whole surface of the board 33 is temporarily produced when the chip 32 is pressed on the board 33 by the thermopressing head 30, the adhesive 39 is prevented from flowing between the bump 36 of the chip 32 and the pad 34 of the board 33. The adhesive 39 may be applied to the surface of the board 33, except for the pad 34, by using the printing technique.

Figure 4:
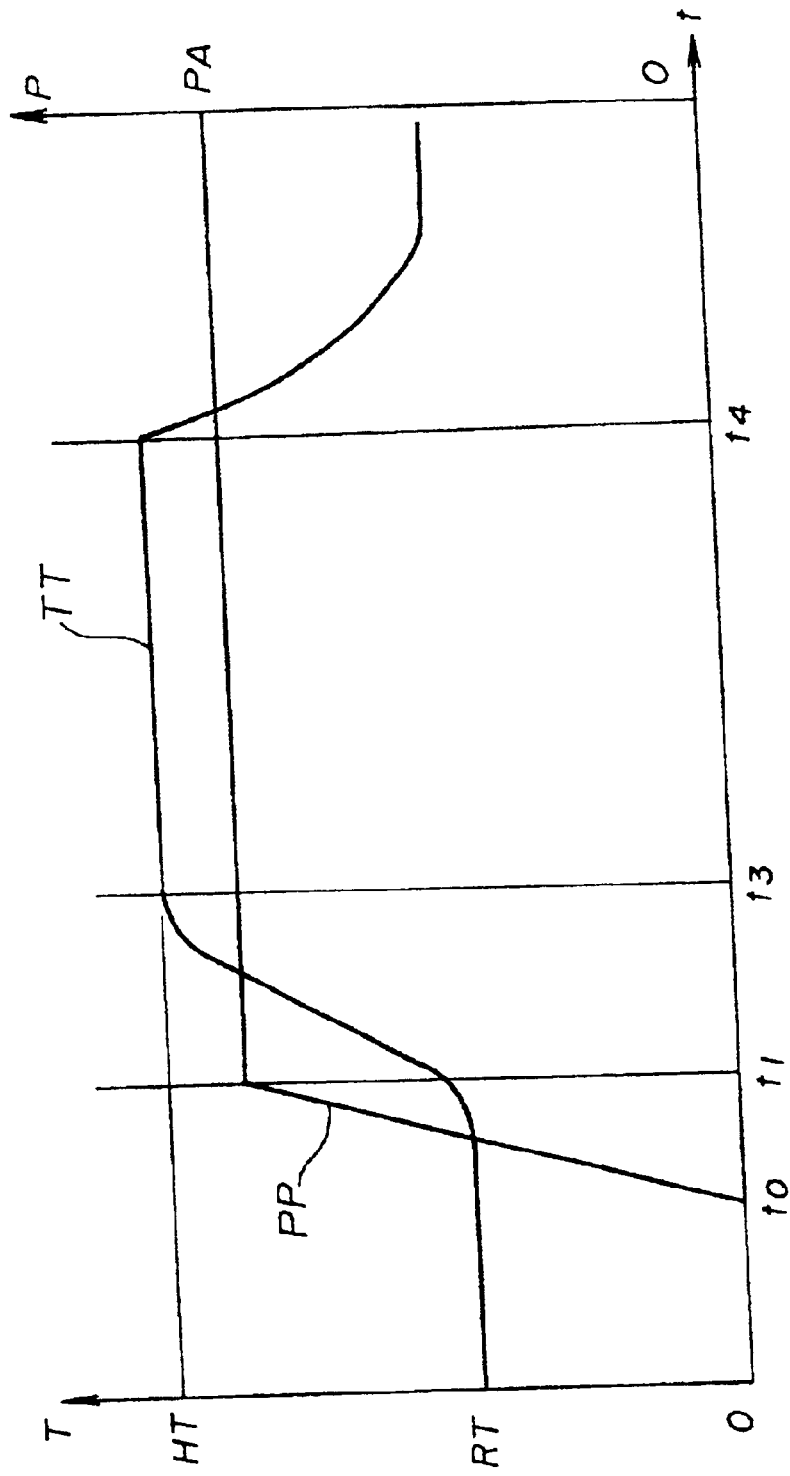
FIG. 4 is a timing chart illustrating a variation of contact pressure of a bump to a pad and a variation of adhering temperature.

FIG. 4 is a timing chart indicating a time variation of the temperature and pressure in a thermopressing step. In FIG. 4, the axis of the abscissa indicates the time t and the axis of ordinate indicates the temperature T and the pressure P.

In a state where the chip 32 is set in the thermopressing head 30, the thermopressing head 30 start to go down toward the table 40. The chip 32 is pressed on the board 33 by the thermopressing head 30. While the thermopressing head 30 is going down, the contact pressure PP of the bump 36 of the chip 32 to the pad 34 of the board is gradually increased from a time $t_0$.

In addition, the temperature TT of the adhesive 39 is gradually increased from room temperature RT. The reason is that the thermopressing head 30 is preheated by the heater 301 at a temperature sufficient to harden the adhesive 39.

While the temperature TT of the adhesive 39 is gradually increased, liquidity of the adhesive 39 is temporarily produced, that is, the viscosity of the adhesive is decreased. Thus, the adhesive 39 applied to the surface of the pad 34 is eliminated by the bump 36 being pressed on the pad 34. As a result, the adhesive 39 will not be present between the bump 36 and the pad 34.

While the thermopressing head 30 is moving further down, the contact pressure PP and the temperature TT of the adhesive 39 are increased. The thermopressing head 30 stops movement at a time $t_1$ and is maintained at the position. At this time ($t_1$), the contact pressure PP of the bump 36 to the pad 34 is maintained at a value PA shown in FIG. 5.

Figure 5:
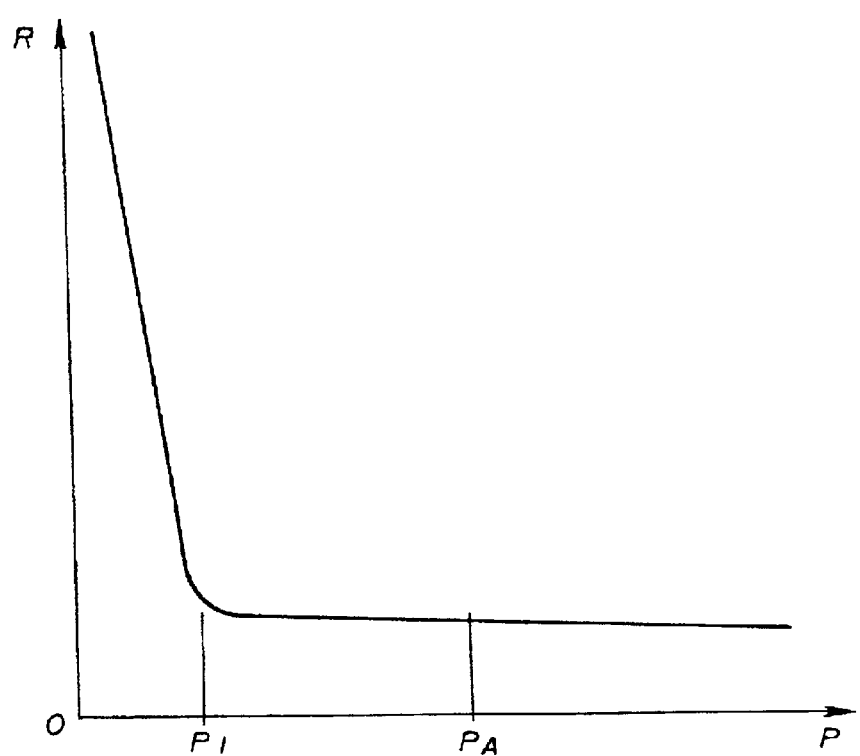
FIG. 5 is a characteristic diagram illustrating a variation of contact resistance to a variation of contact pressure between gold (Au) and copper (Cu)

FIG. 5 shows a relationship between the contact pressure P and the electrical contact resistance R between the gold (Au) and the copper (Cu). In a region in which the contact pressure P is small, the electrical contact resistance is large. This region means that the connection between the gold and the copper is inferior. When the contact pressure P is increased and reaches a value equal to or greater than P1, the electrical contact resistance rapidly decreases. This state means that the connection between the gold and the copper is favorable.

The value PA at which the contact pressure PP of the bump 36 to the pad 34 should be controlled is set so as to be greater than the value P1. For example, it is preferable that the value PA is set at 30 grams. The value PA of the contact pressure PP is a value sufficient to provide plastic deformation to not only the end portion of the bump 36 but also the root portion of the bump 36. In addition, due to the contact pressure PP at the value PA, the pad 34 of the board 33 is subjected to plastic deformation by the bump 36.

At the time $t_1$, the temperature TT of the adhesive 39 does not reach a hardening temperature HT at which the adhesive 39 should be hardened. At a time $t_3$, the adhesive 39 starts to be heated at the hardening temperature HT. Until the time $t_3$ the adhesive 39 is gradually hardened. From the time $t_3$, the adhesive 39 is heated at the hardening temperature HT so as to be rapidly hardened. A time needed to completely harden the adhesive 39 depends on ingredients of the adhesive 39 and is, for example, within a range between 15 seconds and 20 seconds.

Until the adhesive 39 is completely hardened, the thermopressing head 30 maintains the bump 36 in a state in which it is pressed on the pad 34 with a contact pressure PP of the value PA. At a time t4, after the adhesive 39 is completely hardened, the vacuum cavity 302 of the thermopressing head 30 is returned to atmospheric pressure so that the chip 32 is released from being supported by the thermopressing head 30. The thermopressing head 30 then starts to go up. Since the adhesive 39 is released from being heated by the thermopressing head 30, the temperature of the adhesive 39 is gradually decreased to the room temperature RT.

With decreasing of the temperature, the volume of the adhesive 39 is decreased, that is, the adhesive 39 is contracted. Thus, it is expected that the contact pressure is temporarily decreased immediately after the head 30 goes up and is separated from the chip 31. However, due to the contraction of the adhesive based on the decreasing temperature, a tension force is generated between the chip 31 and the board 33. As a result, the pressure force of the bump 36 to the pad 34 returns to and can be maintained at the initial value PA.

Thus, in a state where the chip 31 is used inside electronic equipment, even if the adhesive 39 is expanded and contracted based on the variation of the temperature, a decrease of the contact pressure of the bump 36 to the pad 34 can be limited to a minimum value. As a result, the reliability of the electrical connection of the chip 1 with the board 33 can be maintained.

The thermopressing head 30 from which the chip 32 has been separated is maintained at the hardening temperature of the adhesive. In the manufacturing process, the next chip is then supported on the thermopressing head 30 by the vacuum suction force.

[Modifications of the Embodiment]

In the above embodiment, the conductive paste 38 covering the surface of the bump 36 is made of resin in which silver fillers are distributed. However, the conductive paste 38 may be made of anisotropic conductive adhesive in which capsules are distributed, each of the capsules being formed by covering silver articles with resin. In this case, the cover of each of the capsules is broken when the bump is pressed on the pad. The silver articles being positioned between the bump and the pad.

In addition, the electrical connection between the bump 36 and the pad mainly depends on the direct contact of the bump 36 with the pad. The conductive paste 38 is additionally used for the electrical connection between the bump 36 and the pad. The conductive paste 38 is not necessarily needed.

The bump 38 may have a shape (e.g., a cylindrical shape) other than a shape having the bowl-shaped root portion and the end portion as described above.

The adhesive 39 may be heated by a heater provided near the table, as a substitute for the heater 301 mounted in the thermopressing head.

The adhesive 39 is previously applied to the board 33. After the bump 36 is pressed on the pad, the adhesive 39 may be put into the space between the chip and the board. However, it is preferable that the adhesive 39 is previously applied to the board 33 before the bump 39 is pressed on the pad as described in the above embodiment.

A description will now be given of the mounting method of the semiconductor device according to another embodiment of the present invention.

Figure 6:
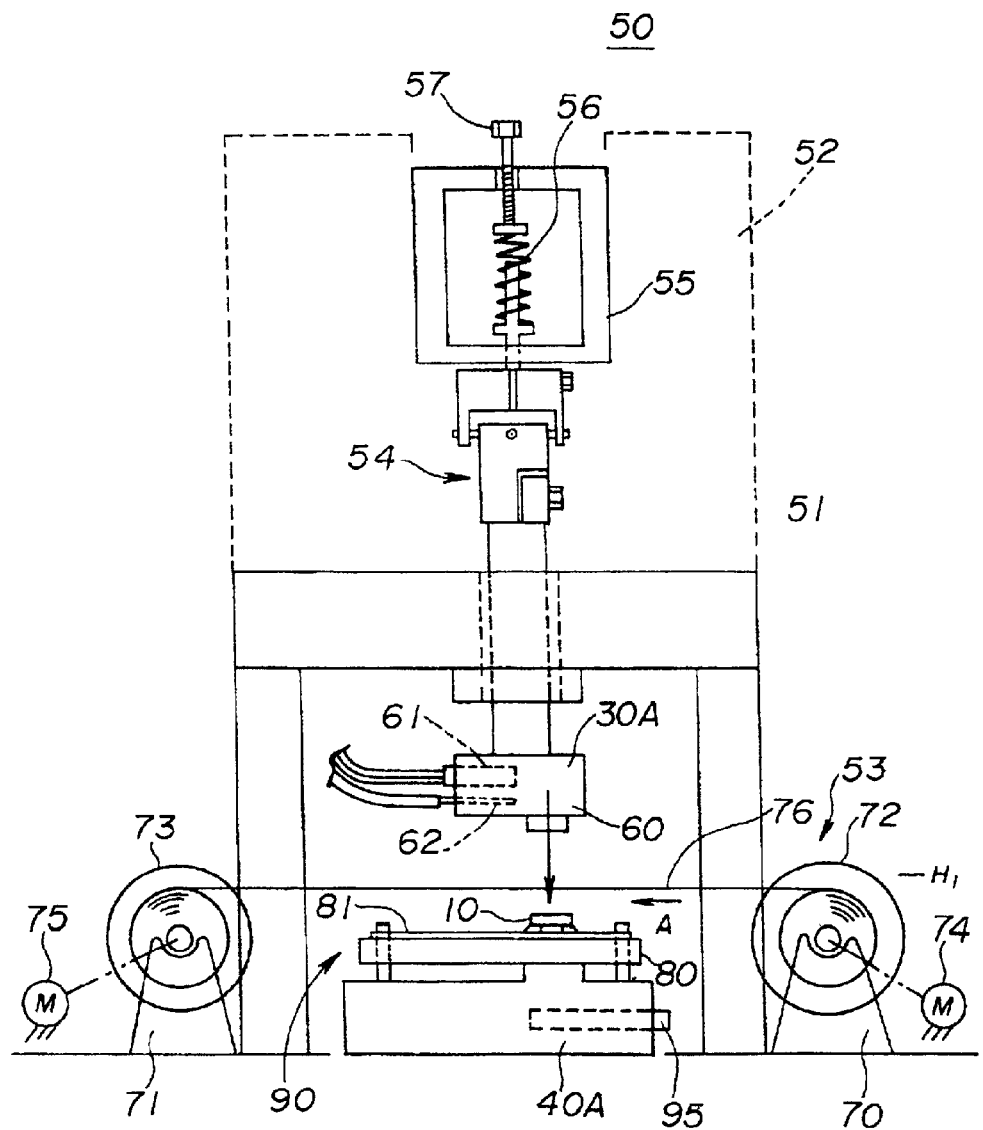
FIG. 6 is a diagram illustrating an example of a chip mounting machine.

In this embodiment, a chip mounting machine 50 as shown in FIG. 6 is used to mount a chip on a board. The chip mounting machine 50 has a head 30A, a raising and lowering mechanism 52, a table 40, a transferring mechanism 53 and a head supporting mechanism 54. The raising and lowering mechanism 52 is mounted on a gate-shaped block 51 and causes the head 30A to reciprocate up and down. The head supporting mechanism 54 supports the head 30A.

A heater 61 and a thermocouple 62 are mounted in a head body 61 of the head 30A. The head 30A is heated at 170° C. which is the hardening temperature of the adhesive 39.

The transferring mechanism 53 has reel supporting blocks 70 and 71 installed at both sides of the gate-shaped block 51, reels 72 and 73 rotatably supported by the reel supporting blocks 70 and 71, motors 74 and 75 rotating the reels 73 and 74, and a polyimide film sheet 76. The polyimide film sheet 76 is wound on the reels 72 and 73 from both sides thereof so as to cross the gate-shaped block 51. A stainless steel plate 80 which is used as a jig is transferred by a conveyer and set on the table 40A. The polyimide film sheet 76 is located at a position (H1) slightly higher than the stainless steel plate 80 set on the table 40A. The polyimide film sheet 76 is transferred in a direction A by rotation of each of the reels 72 and 73 respectively driven by the motors 74 and 75.

The polyimide film sheet 76 has a relatively low thermal conductivity, such as 12° C./cm. The thickness of the polyimide film sheet 76 is 25 μm. A heater 95 is mounted in the table 40A, so that the table 40A is heated at 80° C.

The raising and lowering mechanism 52 causes a guide 55 of a head supporting mechanism 54 to go up and down (vertically reciprocate).

A description will now be given of the chip mounting method using the chip mounting machine 50 having the structure as described above.

First, the chip 10 is provisionally mounted on a flexible printed circuit board 81 which is fixed on the stainless steel plate 80, using a chip provisional mounting machine (not shown). As a result, a semi-finished product 90 in which the chip 10 is provisionally mounted is formed. Next, the semi-finished product 90 is transferred to the chip mounting machine 50 by the conveyer and set therein. The head 30A presses the chip 10 on the flexible printed circuit board 81, with heat, so that the chip 10 is completely mounted on the flexible printed circuit board 81.

FIG. 6 shows a state in which the semi-finished product 90 transferred into the chip mounting machine 50 is positioned and set on the table 40A. The polyimide film sheet 76 is slightly over the chip 10.

Figure 7:
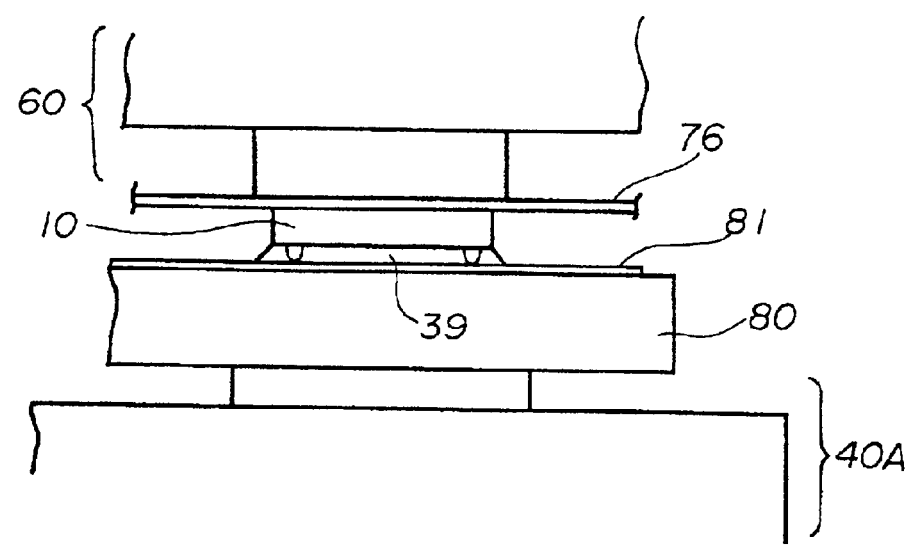
FIG. 7 is a diagram illustrating a polyimide film set between the head and the chip in the thermopressing step.

After it is recognized that the semi-finished product 90 is positioned and set on the table 40A, the raising and lowering mechanism 52 is operated so that the head 30A moves downwardly. As enlarged and shown in FIG. 7, the head 30A presses the chip 10 on the flexible circuit board 81 with application of heat. Between the head 30A and the chip 10, the polyimide film sheet 76 is set. After a predetermined time has elapsed, the head 30A is caused to move upwardly and separate from the chip 10.

When the raise and fall mechanism 50 is operated so that the head supporting mechanism 54 moves downwardly and the head 30A is brought into contact with the chip 10, a spring 56 starts to be compressed. After this, the pressure of the head 30A to the chip 10 is increased by increasing the amount of compression of the spring 56. The raising and lowering mechanism 50 is operated until the amount of compression of the spring 56 reaches a predetermined value. An initial amount of compression of the spring 56 is adjusted by a screw 57.

Figure 8:
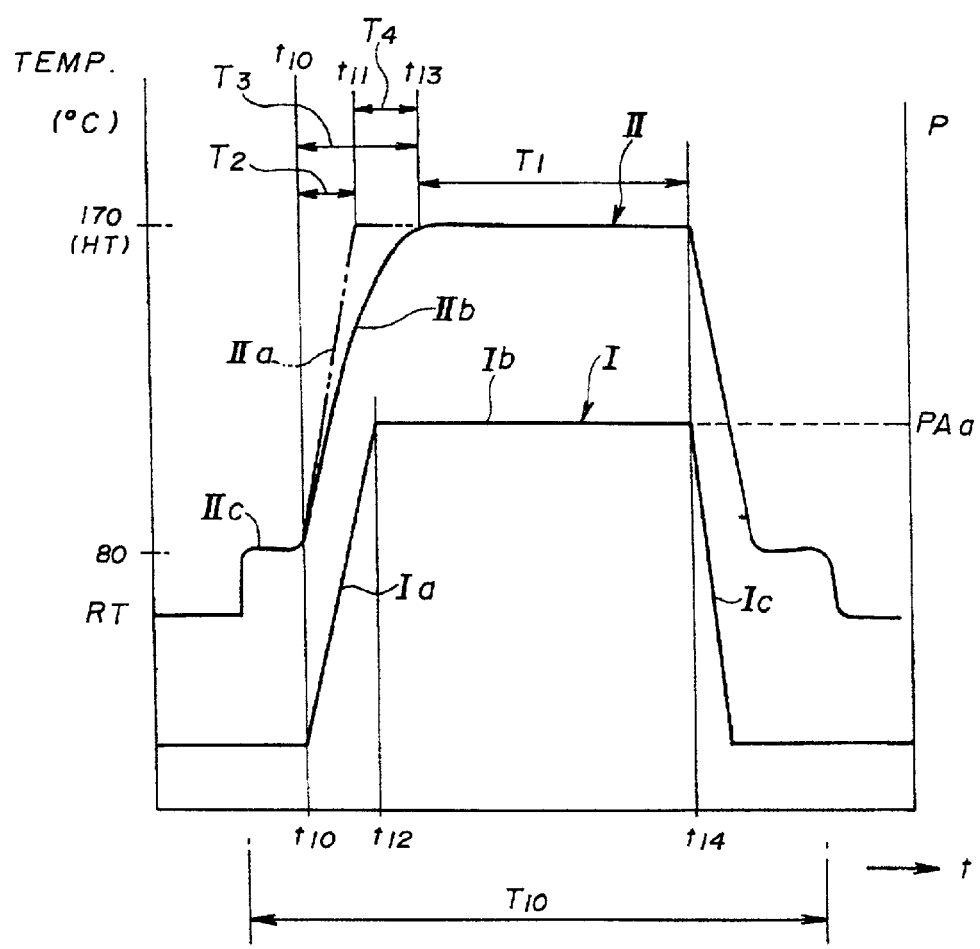
FIG. 8 is a diagram illustrating a variation of a pressing force of the head to the chip and a variation of the temperature of the-adhesive.

The pressing characteristic of the head 30A pressing the chip 10 is indicated by a line I in FIG. 8. That is, the pressure of the head 30A to the chip 10 is gradually increased starting from a time $t_{10}$ as indicated by a line Ia and reaches a value PAa at a time $t_{12}$. After this, the pressure is maintained at the value PAa as indicated by a line Ib and is gradually decreased starting from a, time $t_{14}$ as indicated by a line Ic. The time $t_{14}$ is a time at which a time period T1 that is needed to completely harden the adhesive 39 elapses from a time $t_{13}$ at which the temperature of the adhesive 39 reaches the hardening temperature of 170° C.

In addition, starting from a time at which the head 30A is brought into contact with the chip 10, the adhesive 39 is heated via the chip 10 until the temperature of the adhesive 39 reaches the hardening temperature of 170° C. The temperature of the adhesive 39 varies as indicated by a line II in FIG. 8.

If the polyimide film sheet 76 is not set between the head 30A and the chip 10 so that the head 30A is in direct contact with the chip 10, the temperature of the adhesive 39 is rapidly increased as indicated by a line IIa in FIG. 8. A time period T2 between the time $t_{10}$ at which the head 30A is brought into contact with the chip 10 and a time 11 at which the temperature of the adhesive 39 reaches the hardening temperature of 170° C. is relatively short. As a result, the time $t_{12}$ at which the pressure of the head 30A to the chip 10 reaches the predetermined value PAa is after the time $t_{11}$. That is, before the pressure of the head 30A to the chip 10 reaches the predetermined value PAa, the adhesive starts to be hardened. Thus, some of the bumps 36 may be incompletely joined to the pads.

On the other hand, according to the above method of the present invention, since the polyimide film sheet 76 is set between the head 30A and the chip 10, the heat is transmitted through the polyimide film sheet 76 having a low thermal conductivity to the adhesive 39. As a result, the temperature of the adhesive 39 is increased, starting from the time $t_{10}$ at which the head 30A starts to press the chip 10, to the hardening temperature of 170° C. as indicated by a line IIb. The line IIb is more gently sloping than the line IIa. A time period T3 between the time $t_{10}$ at which the head 30A starts to press the chip 10 and the time $t_{13}$ at which the temperature of the adhesive 39 reaches the hardening temperature of 170° C. is greater than the time period T2 described above by T4.

Thus, the pressure of the head 30A to the chip 10 reaches the predetermined value PAa at the time $t_{12}$, before the time $t_{13}$. That is, before the adhesive 30 starts to be hardened, the pressure of the head 30A to the chip 10 reaches the predetermined value PAa. After the pressure reaches the predetermined value, the adhesive 39 starts to harden. As a result, the bump 36 is appropriately pressed on the pad so as to be securely joined to the pad. Thus, the chip 10 can be mounted on the board with a high reliability.

In addition, in FIG. 8, a line IIc indicates an increasing characteristic of the temperature of the adhesive 39 when the semi-finished product 90 is set on and heated by the table 40A.

Since the polyimide film sheet 76 has a heat resistance property, the polyimide film sheet 76 does not adhere to the head 30A and chip 10. The polyimide film sheet 76 is flexible, so that the surface of the chip 10 is not damaged.

After the head 10A moves upwardly and is separated from the chip 10, the motors 73 and 74 are driven so that the polyimide film sheet 76 is moved by one step. As a result, a part of the polyimide film sheet 76 which was set between the head 30A and the chip 10 is moved to the outside of the gate-shaped block 51 and a new part of the polyimide film sheet 76 which has not yet been used is fed into a space in the gate-shaped block 51. The new part of the polyimide film sheet 76 is used for the next semi-finished product 90 so as to be set between the head 30A and the chip 10.

A polyester film sheet or a silicon film sheet may be substituted for the polyimide film sheet 76.

Instead of setting material having a low thermal conductivity, such as the polyimide film sheet 76, between the head 30A and the chip 10, the head 30A may be temporarily cooled immediately before the head 30A is brought into contact with the chip 10.

If the heater in the head 30A is turned on after the head 30 presses the chip 10, the adhesive 39 can start to be hardened after the pressure of the head 30A to the chip 10 reaches the-predetermined value PAa without the polyimide film sheet 76. However, according to this method, a time period required for mounting the chip is increased, so that production deteriorates. From a viewpoint of production, the method according to the above embodiment of the present invention is preferable.

The present invention is not limited to the aforementioned embodiments, and other variations and modifications may be made without departing from the scope of the claimed invention.

What is claimed is:

1. A structure comprising:
    a semiconductor device having bumps;
    a board having pads so that each of the bumps is joined to a corresponding one of the pads, each of the pads per se having a deformed surface with which a corresponding one of the bumps contacts; and
    an insulating adhesive provided between the semiconductor device and the board, and in contact with each of the pads and bumps wherein
    an end of each of the bumps has a diameter smaller than other portions of the bumps so as to facilitate deformation of the pad when bumps are pressed against the pads and to form a space in which the insulating adhesive is filled, and wherein
    contraction of the insulating adhesive maintains joints of the bumps and the pads, said joints being made by deformation of the pads.

\* \* \* \* \*